(12) United States Patent
Onaran et al.

(10) Patent No.: US 12,063,469 B2
(45) Date of Patent: Aug. 13, 2024

(54) MEMS DEVICE WITH A TMD STRUCTURE

(71) Applicant: Infineon Technologies AG, Neubiberg (DE)

(72) Inventors: Abidin Güçlü Onaran, Munich (DE); Marc Fueldner, Neubiberg (DE); Dietmar Straeussnigg, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 384 days.

(21) Appl. No.: 17/647,653

(22) Filed: Jan. 11, 2022

(65) Prior Publication Data

US 2022/0279270 A1    Sep. 1, 2022

(30) Foreign Application Priority Data

Mar. 1, 2021  (EP) ..................................... 21160096

(51) Int. Cl.
| | |
|---|---|
| *H04R 7/06* | (2006.01) |
| *B81B 3/00* | (2006.01) |
| *H04R 1/28* | (2006.01) |
| *H04R 7/16* | (2006.01) |
| *H04R 19/04* | (2006.01) |

(52) U.S. Cl.
CPC ......... *H04R 1/2807* (2013.01); *B81B 3/0078* (2013.01); *H04R 7/06* (2013.01); *H04R 7/16* (2013.01); *H04R 19/04* (2013.01); *B81B 2201/0257* (2013.01); *B81B 2203/0127* (2013.01); *B81B 2203/04* (2013.01); *H04R 2201/003* (2013.01)

(58) Field of Classification Search
CPC .......... H04R 1/2807; H04R 7/06; H04R 7/16; H04R 19/04; H04R 2201/003
See application file for complete search history.

(56) References Cited

U.S. PATENT DOCUMENTS

| | | | | |
|---|---|---|---|---|
| 2007/0068756 | A1* | 3/2007 | Huston | ................. F16F 7/1005 267/140.15 |
| 2015/0377624 | A1* | 12/2015 | Falorni | ................. B81B 3/0018 73/504.12 |
| 2018/0231090 | A1 | 8/2018 | Gnerlich et al. | |
| 2019/0084827 | A1 | 3/2019 | Dehe et al. | |
| 2020/0137473 | A1 | 4/2020 | Tsuchihashi et al. | |
| 2020/0382861 | A1* | 12/2020 | Hrudey | .................... H04R 7/16 |

FOREIGN PATENT DOCUMENTS

WO        2021024690 A1    2/2021

* cited by examiner

*Primary Examiner* — Suhan Ni
(74) *Attorney, Agent, or Firm* — Slater Matsil, LLP

(57) ABSTRACT

A MicroElectroMechanical (MEMS) device includes a suspended electrode structure anchored to a substrate, the MEMS device having a MEMS resonance mode, and a Tuned Mass Damping (TMD) structure, wherein a portion of the suspended electrode structure forms a TMD structure having a TMD spring element and a TMD mass element, for providing a TMD resonance mode counteracting the MEMS resonance mode.

17 Claims, 11 Drawing Sheets

US 12,063,469 B2

MEMS DEVICE WITH A TMD STRUCTURE

CROSS-REFERENCE TO RELATED APPLICATIONS

This application claims the benefit of European Patent Application No. 21160096, filed on Mar. 1, 2021, which application is hereby incorporated herein by reference.

TECHNICAL FIELD

Embodiments of the present disclosure relate to a MEMS device (MEMS=micro electromechanical system) with a TMD (tuned mass damping) structure. More specifically, embodiments relate to the field of MEMS microphones using tuned mass dampers (TMDs) for resonant mode control.

BACKGROUND

The sensing of environmental parameters in the ambient atmosphere, such as sound, noise, temperature, gasses, etc., with MEMS-based devices gains more and more importance in the implementation of appropriate sensors within mobile devices, home automation, such as Smart Home, and the automotive sector.

MEMS sensors may produce, e.g. due to non-symmetries of the sensor arrangement, a net external vibration or resonance when reading out the MEMS sensor signal. Moreover, in audio microphone applications of a MEMS sensor, different undesired MEMS resonance modes can be observed, which may result from a mechanical interaction between the different elements and components of the MEMS microphone. Such undesired resonance modes may affect the operational characteristics of the MEMS sensor.

Therefore, there is a need in the field of MEMS sensors, e.g., of MEMS microphones, to implement a MEMS sensor having improved operational characteristics, e.g. an improved noise performance and an improved resonance performance.

Such a need can be solved by the MEMS device according to independent claim 1. Further, specific implementations of the MEMS device are defined in the dependent claims.

SUMMARY

According to an embodiment a MEMS device comprises a suspended electrode structure anchored to a substrate, the MEMS device having a MEMS resonance mode, and a TMD (tuned mass damping) structure, wherein a (integral) portion of the suspended electrode structure is arranged to form the TMD structure having a TMD spring element and a TMD mass element, for providing a TMD resonance mode counteracting the MEMS resonance mode.

By implementing a TMD structure (TMD=tuned mass damping) with the suspended electrode structure of the MEMS device According to the present concept of a MEMS device, the undesired MEMS resonance mode(s) of the MEMS device can be reduced by implementing a TMD structure (TMD=tuned mass damping) with the suspended electrode structure of the MEMS device, wherein a portion of the suspended electrode structure itself is arranged to at least partially or completely form the TMD spring element and the TMD mass element of the TMD structure. Thus, the TMD structure is an integral part of the suspended electrode structure. The flexibility (compliance) of the TMD spring element and the mass of the TMD mass element can be set in that the resulting TMD resonance mode of the TMD structure counteracts the MEMS resonance mode.

In case, the MEMS device is implemented as an audio MEMS microphone, the MEMS device comprises a first and a second suspended electrode, which are both spaced apart from each other and at least partially oppose each other, and which are both anchored to the substrate. The first electrode is a deflectable membrane element and the second electrode is a static counter-electrode (stator or backplate), wherein the TMD structure is an integral portion of the movable membrane element and/or of the static counter-electrode.

BRIEF DESCRIPTION OF THE DRAWINGS

In the following, embodiments of the present disclosure are described in more detail with reference to the figures, in which.

In the following description, embodiments are discussed in further detail using the figures, wherein in the figures and the specification identical elements and elements having the same functionality and/or the same technical or physical effect are provided with the same reference numbers or are identified with the same name. Thus, the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, some of the figures comprise a Cartesian coordinate system x, y, z, wherein the x-y-plane corresponds, i.e. is parallel, to a first main surface region of a substrate (=a reference plane=x-y-plane), wherein the direction vertically up with respect to the reference plane (x-y-plane) corresponds to the "+z" direction, and wherein the direction vertically down with respect to the reference plane (x-y-plane) corresponds to the "−z" direction. In the following description, the term "lateral" means a direction parallel to the x- and/or y-direction, i.e. parallel to the x-y-plane, wherein the term "vertical" means a direction parallel to the z-direction.

The teachings of the present specification are based on the following general considerations of the frequency behavior and resonance modes of the MEMS sensors, e.g. audio MEMS microphones, and the resulting effects thereof to the operational characteristics of the MEMS microphone.

Figure 1A:
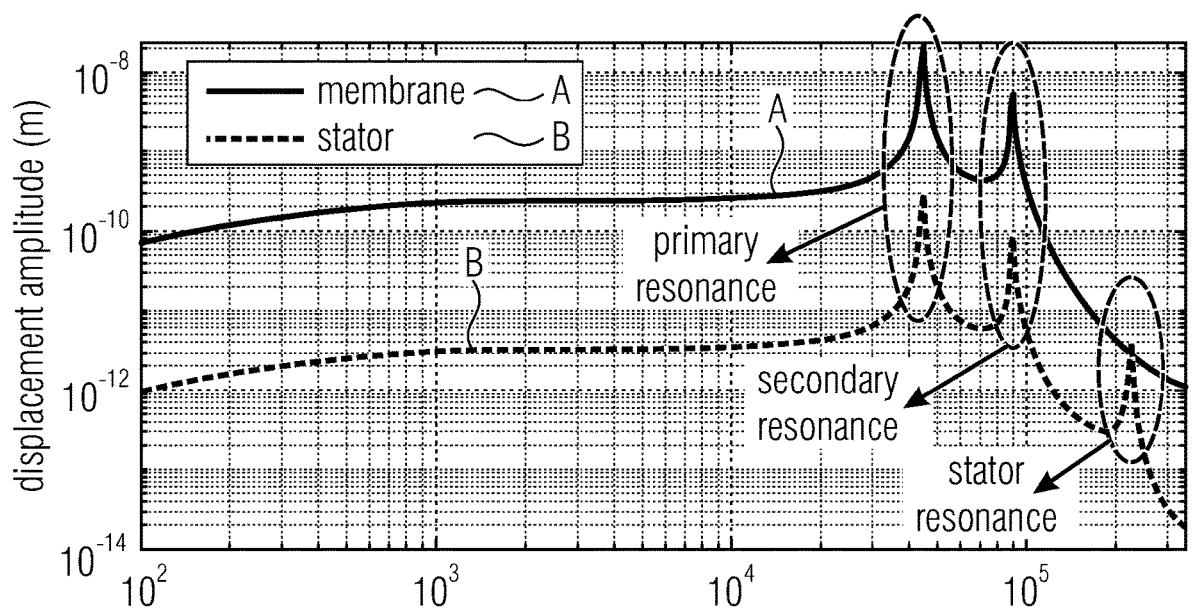
FIG. 1a shows an exemplary illustration of a course of the displacement (deflection) of the membrane structure and the stator of a MEMS device (e.g. a MEMS microphone) in response to an acoustic input signal or an acoustic excitation as a function of frequency.
Figure 1B:
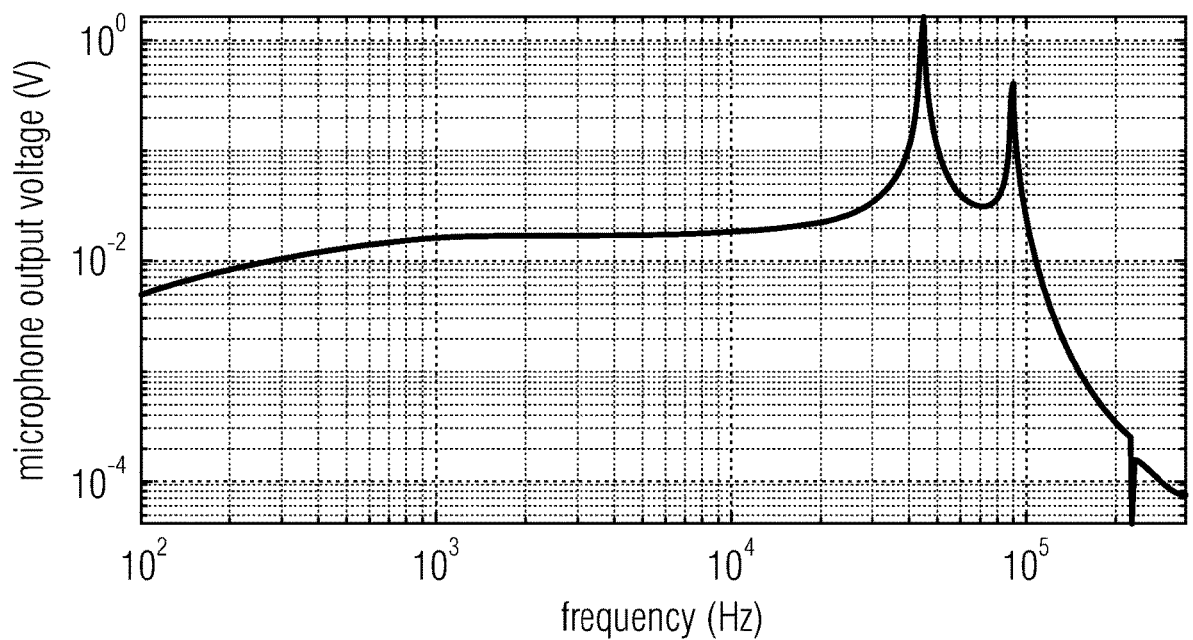
FIG. 1b shows an exemplary illustration of the course of the output voltage of the MEMS device in response to the acoustic input signal as a function of frequency.

FIG. 1a shows an exemplary illustration of the course of the displacement (deflection) of the membrane structure and the stator of a MEMS device (e.g. an audio MEMS microphone) in response to an acoustic input signal or acoustic excitation as a function of frequency. FIG. 1b shows an exemplary illustration of the course of the output voltage of the MEMS device in response to the acoustic input signal (acoustic excitation) as a function of frequency.

As exemplarily shown in FIG. 1a, the MEMS microphone is a dynamic system which has various resonances (MEMS resonance modes) due to the interaction of numerous different components of the system. The components may comprise, for example, the membrane structure, the stator (counter-electrode or backplate), the sound port and the back volume of the MEMS microphone. FIG. 1a shows the displacement of the membrane and stator of a MEMS microphone in response to an acoustic input signal, e.g. sound or noise, as a function of frequency. As it can be seen from FIG. 1a, there are essentially three distinct undesired MEMS resonances of the MEMS microphone.

At the primary resonance, which has the lowest frequency, the sound port air mass moves in phase with the membrane mass. The restoring force is produced by the membrane and the back volume compliance. To be more specific, the mass of the air within the sound port and the membrane form a resonator with the spring restoring force that acts on the membrane. This resonant mode is usually the lowest in frequency among other resonant modes of the system. From a system design perspective, it is desirable to avoid the amplitude peaking associated with this resonance in the acoustic band, wherein this introduces a compromise between system noise level and acceptable frequency response peaking behavior.

For providing a primary resonance control at a MEMS sensor (MEMS microphone), a suitable shape selection of the input sound port and/or acoustic meshes at the sound port may be provided. In order to reduce the quality factor of the primary resonance, it is necessary to add damping, this time primarily through the viscous damping in the flow within the sound port. However, this adds noise and/or moves the frequency of the primary resonance into the acoustic frequency band, wherein both effects are undesirable.

The secondary resonance arises at a second frequency (higher than the first resonance frequency of the primary resonance) when the membrane mass and the sound port air mass move out of phase. The restoring force is provided by the compliance of the front cavity, the membrane and the back volume.

The third resonance (stator resonance) mode arises when the contributors are the mass and the compliance of the stator. A damping is provided by the viscous damping between the stator and the membrane(s).

An approach for reducing or controlling the stator oscillations (=the third resonance mode) may be to add viscous (air) damping, specifically in between the membrane and the stator. This lowers the quality factor Q of the unwanted (third) resonance. However, the air damping between the stator and the membrane is a major contributor of the microphone noise. The so-called sealed dual membrane (SDM) microphones may reduce this noise by reducing the viscosity of the air cushion by means of reduced cavity pressure (between the dual membrane and the stator). A high stator quality factor (~120) in sealed dual membrane (SDM) microphones is required for low noise. A compromise is necessary between noise and resonance performance (=suppression of undesired resonances).

Figure 2A:
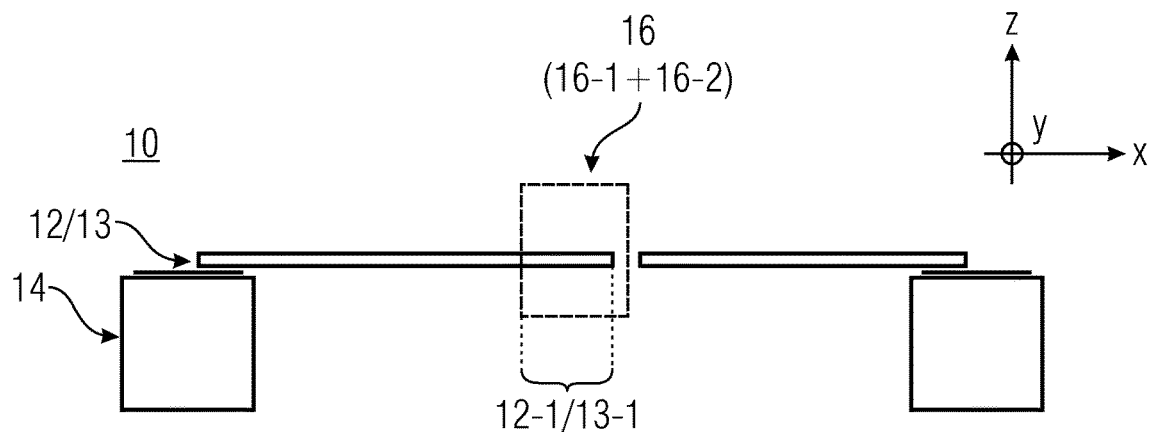
FIG. 2a shows a schematic cross-sectional view of a MEMS device having a TMD structure according to an embodiment.
Figure 2B:
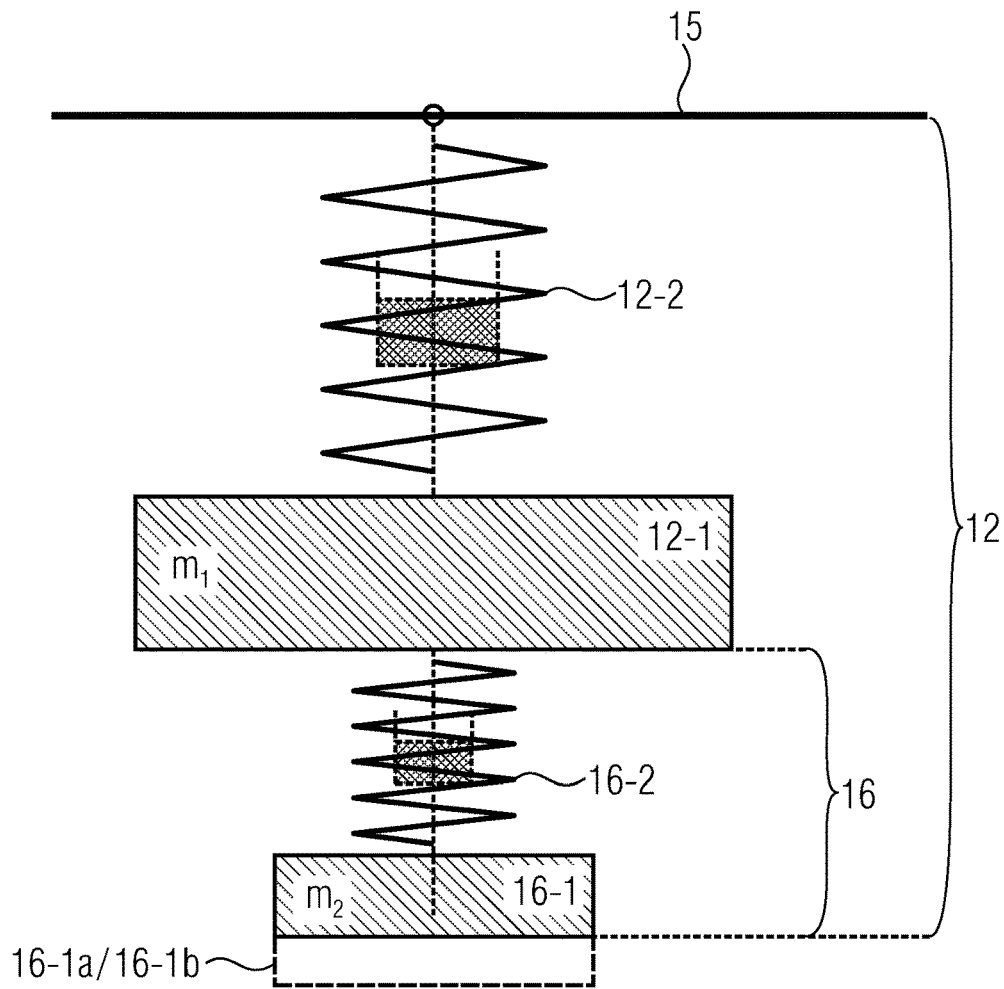
FIG. 2b shows a schematic view of a resulting spring-mass-damper system of the MEMS device with the integrally formed TMD structure according to an embodiment.

FIG. 2a shows a schematic cross-sectional view of a MEMS device 10 according to an embodiment. FIG. 2b shows a schematic view of the resulting spring-mass-damper system of the MEMS device 10 with the TMD structure 16 as (integral) part of the suspended electrode 12/13 according to an embodiment.

According to the embodiment, the MEMS device 10 comprises a suspended electrode structure 12/13 anchored to a substrate 14. The MEMS device 10 has a MEMS resonance mode, such as an undesired MEMS resonance mode, at a resonance frequency.

In this connection, it is again referred to FIGS. 1a-1b exemplarily showing examples of the different resonance modes of the MEMS device 10 in form an audio MEMS microphone. The MEMS device 10 further comprises a TMD structure 16 (TMD=tuned mass damping), wherein a portion 12-1 of the suspended electrode structure 12 is arranged to form, e.g., integrally form, the TMD structure 16 having a TMD mass element 16-1 and a TMD spring element 16-2 for providing a TMD resonance mode at a TMD resonance frequency counteracting the MEMS resonance mode. The integral portion 12-1 of the suspended electrode structure 12 is arranged to at least partially or completely form the TMD mass element 16-1 and the TMD spring element 16-2 of the TMD structure 16. The flexibility (stiffness) of the TMD spring element 16-2 and the mass of the TMD mass element 16-1 can be set in that the resulting TMD resonance mode of the TMD structure 16 counteracts the MEMS resonance mode. The resonance frequency of the TMD resonance mode of the TMD structure 16 can be set to or close to the resonance frequency of the MEMS resonance mode.

As exemplarily shown in FIG. 2b, the suspended electrode structure 12 may form a first mass-spring system, wherein the mass (displaceable mass) of the suspended electrode structure 12 forms the electrode mass 12-1 and the stiffness of the suspended electrode structure 12 forms the electrode spring 12-2, a second mass-spring system with the TMD structure 16. The TMD structure 16 comprises the TMD spring element 16-2 between the electrode mass 12-1 of the suspended electrode structure 12 and the TMD mass element 16-1. The TMD resonance mode is defined by the compliance (stiffness or flexibility) of the TMD spring element 16-2 and the mass of the TMD mass element 16-4 wherein, for example, viscous (air) damping may act onto the oscillation of the TMD structure 16.

The mass of the TMD mass element 16-2 of the TMD structure 16, which acts as a secondary oscillator, may be in a range about 0.1% to 10% of the mass (primary mass) of the suspended electrode structure 12, i.e. of the displaceable portion, of the suspended electrode structure 12, wherein the resonance frequency of the TMD structure 16 should be close to the resonance frequency of the suspended electrode structure 12 (=the primary oscillator). This arrangement of the MEMS device reduces the peak oscillation amplitude of the undesired MEMS resonance mode at the associated resonance frequency.

According to an embodiment of the MEMS device 10, the TMD spring element 16-2 comprises an adjusted modus of resilience (spring constant) and an adjusted TMD mass 16-1 for adjusting a TMD resonance frequency of the TMD resonance mode counteracting to (=damping) the MEMS resonance mode having a MEMS resonance frequency. According to an embodiment, the TMD mass element 16-1 may comprise an additional mass element 16-1a for increasing the resulting TMD mass and for decreasing (adapting) the resulting TMD resonance frequency. The additional mass element may comprise an insulating material (e.g. an oxide block) and/or a conductive material.

According to an embodiment of the MEMS device 10, wherein the TMD structure 16 is an integral portion of the first suspended electrode 12, wherein a separated (=mechanically decoupled from a second electrode) part of a second suspended electrode may form the additional mass element of the TMD structure 16.

According to an embodiment, the MEMS device 10 is operative as an audio microphone in a single counter-electrode (backplate) configuration, a dual counter-electrode configuration or a sealed dual membrane configuration.

Figure 3:
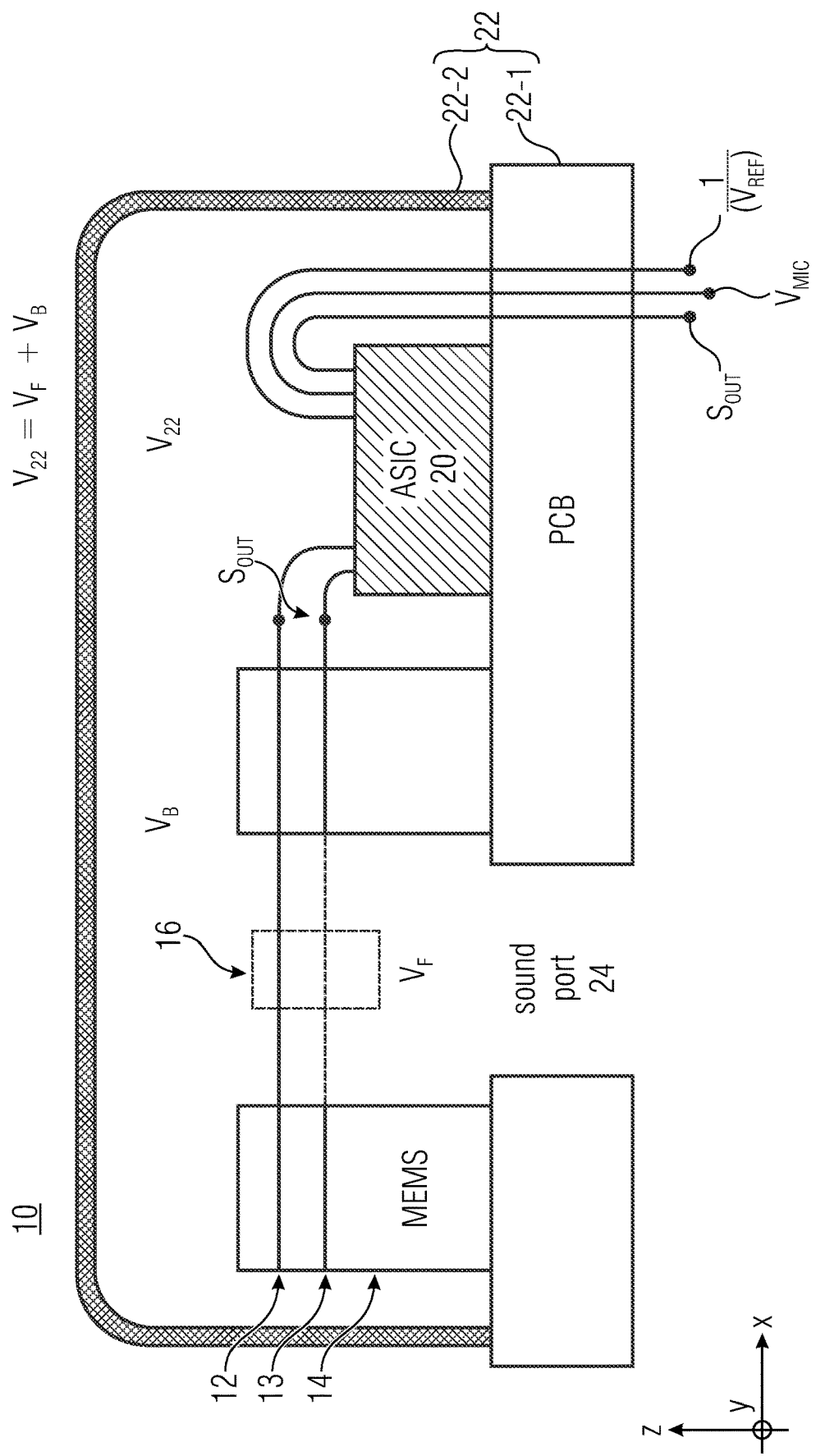
FIG. 3 shows a schematic cross-sectional view of a packaged MEMS microphone with a TMD structure according to an embodiment.

FIG. 3 shows a schematic cross-sectional view of a packaged MEMS microphone with a TMD structure according to an embodiment.

According to an embodiment, the MEMS device 10 comprises a suspended electrode structure 12 anchored to a substrate 14, the MEMS device having a (undesired) MEMS resonance mode, and a TMD (tuned mass damping) structure 16, wherein a portion 12-1/13-1 of the suspended electrode structure 12/13 is arranged to (integrally) form the TMD structure 16 having the TMD spring element 16-2 and a TMD mass element 16-1, for providing a TMD resonance mode counteracting the MEMS resonance mode.

According to an embodiment, the MEMS device 10 comprises a first and a second suspended electrode 12, 13, which are both spaced apart from each other and at least partially oppose each other, and which are both anchored to the substrate 14. According to an embodiment, the first electrode 12 and the second electrode 13 are operative as a sound transducer, a capacitive sensor or an audio microphone.

According to an embodiment, the TMD structure 16 may arranged at a center portion of the first or second suspended electrode 12, 13. Alternatively or additionally, the TMD structure 16 may be arranged at a peripheral portion (laterally offset to the center portion) of the first or second suspended electrode 12, 13. According to an embodiment, the TMD structure 16 may arranged adjacent to a ventilation hole in the first or second suspended electrode 12, 13.

According to an embodiment of the MEMS device 10, e.g. in form of an audio MEMS microphone, the first electrode 12 is a deflectable (movable) membrane element and the second electrode 13 is a static counter-electrode (backplate or stator), and wherein the TMD structure 16 is an integral portion of the membrane element 12 and/or the TMD structure 16 is an integral portion of the counter-electrode 13.

According to a further embodiment of the MEMS device 10, e.g. in form of an audio MEMS microphone, the first electrode 12 is a static counter-electrode (backplate or stator) and the second electrode 13 is a deflectable (movable) membrane element, and wherein the TMD structure 16 is an integral portion of the counter-electrode 12 and/or the TMD structure 16 is an integral portion of the membrane element 13.

Furthermore, FIG. 3 shows a schematic cross-sectional view of the MEMS device 10 and an optional control circuitry 20 (ASIC) in a packaged (housed) configuration. The MEMS device 10 may be arranged in a housing 22 having an interior volume V22, wherein the housing 22 has an access opening or sound port 24 to the interior volume V22 of the MEMS device 10. The MEMS device 10 is arranged in the housing 22, for example, adjacent to the sound opening 24. The housing 22 may then comprise, for example, a substrate 22-1 and an optional cap element 22-2, which can be at least partially or completely electrically conductive. In an exemplary arrangement, the MEMS microphone 10 can subdivide the interior volume V22 into a front volume VF and a back volume VB, wherein the front volume VF is situated in the region between the sound port 24 and the MEMS microphone 10, and wherein the back volume VB is situated on the opposite side of the MEMS microphone 10 with respect thereto in the interior volume V22 of the housing 22.

Figure 4:
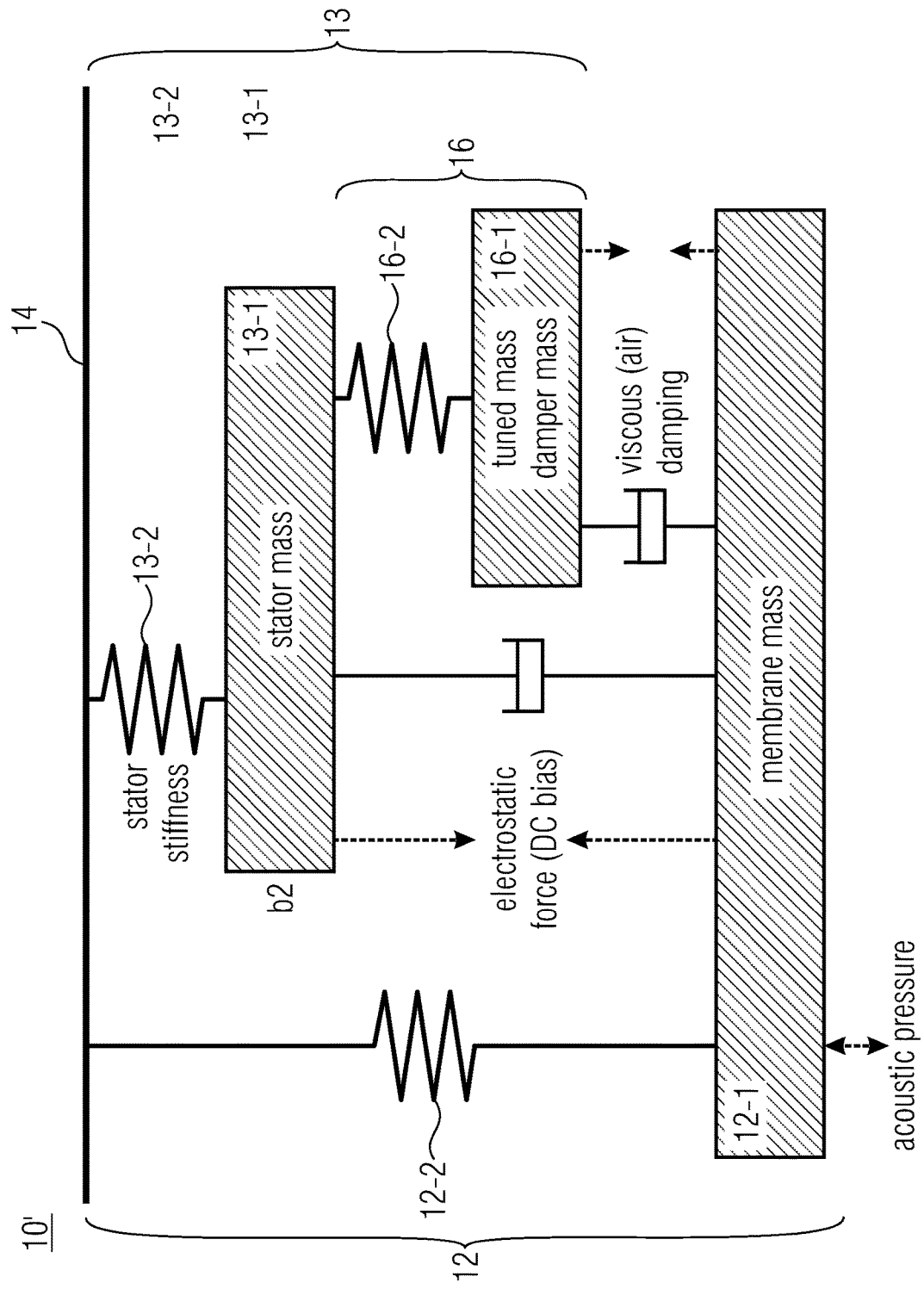
FIG. 4 shows a schematic view of the resulting mass-spring-damper system of a MEMS microphone with a TMD structure as part of the stator according to an embodiment.

FIG. 4 shows a schematic illustration of a tuned mass-spring-damper system of a MEMS microphone 10 with the TMD structure 16 as an integral part of the stator 13 according to an embodiment.

According to an embodiment, the MEMS microphone 10 comprises the first electrode and the second electrode, which are operative as the audio microphone, wherein the first electrode 12 is the deflectable membrane element and the second electrode 13 is the stator, e.g. a static counter-electrode or backplate. According to the embodiment, the TMD structure 16 is an integral portion of the stator 13 (static counter-electrode).

When a DC bias voltage (VMIC) is present between the microphone membrane(s) element 12 and the stator 13 (electrostatic force), the change in distance between the membrane element 12 and the stator 13 induces an AC output voltage $S_{OUT}$.

As shown in FIG. 4, the deflectable (displaceable) membrane element 12 is delectably connected to the substrate 14. The deflectable portion of the membrane element 12 forms the membrane mass element 12-1, wherein the flexibility (stiffness) of the membrane element 12 forms the membrane spring element 12-2. The stator 13 is anchored to the substrate 14, wherein the mass of the stator 13 forms the stator mass element 13-1 and the stator stiffness forms the stator spring element 13-2. The TMD structure 16, which comprises the TMD mass element 16-1 and the TMD spring element 16-2, is an integral portion of the stator 13. An acoustic pressure change from the environment causes a deflection (displacement) of the membrane element 12, wherein a viscous (air) damping is present between the membrane element 12 and the stator 13 and between the membrane element 12 and the TMD structure 16. As shown in FIG. 4, these viscous damping values may be different, wherein the damping values may be selected in that the TMD damping is higher than the stator's main damping.

As already indicated with respect to FIGS. 1a-b, the stator resonance has as contributors the mass and compliance of the stator 13, wherein the damping is provided by the viscous damping between the stator 13 and the membrane(s) 12. The mass of the TMD mass element 16-1 of the TMD structure 16, which acts as a secondary oscillator, may be in a range about 0.1% to 10% of the mass (primary mass) 12-1 of the suspended electrode structure 12, i.e., of the displaceable portion of the suspended electrode structure 12.

Figure 5A:
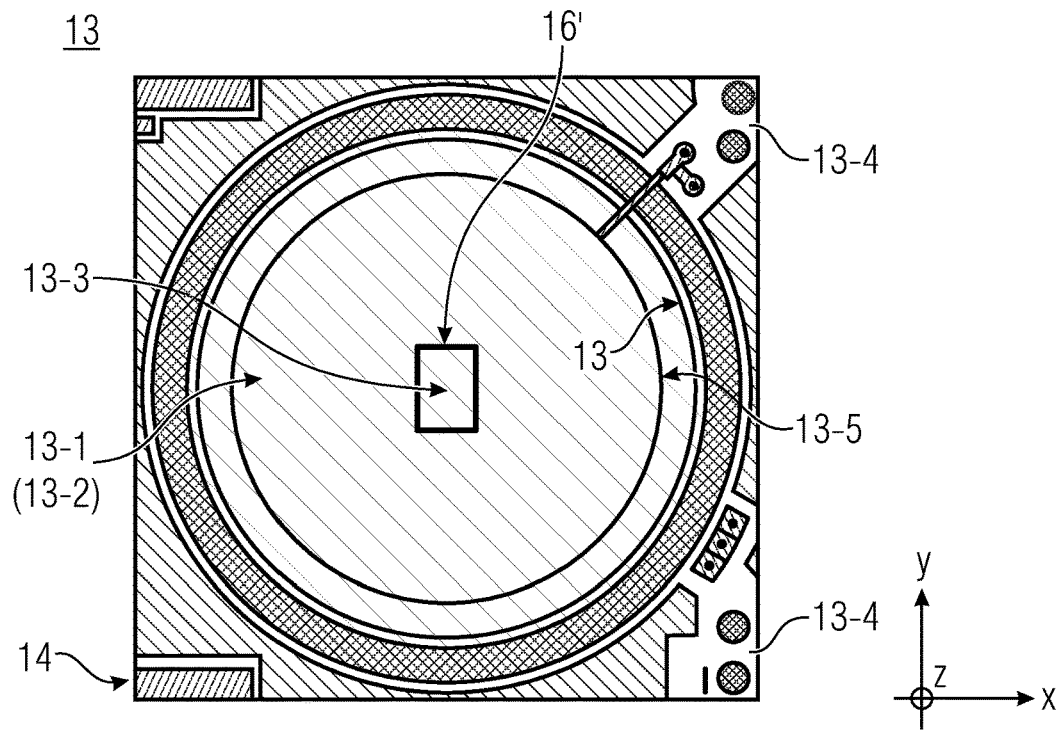
FIG. 5a shows a schematic plane view (top view) of a stator of the MEMS device with the TMD structure according to an embodiment.
Figure 5B:
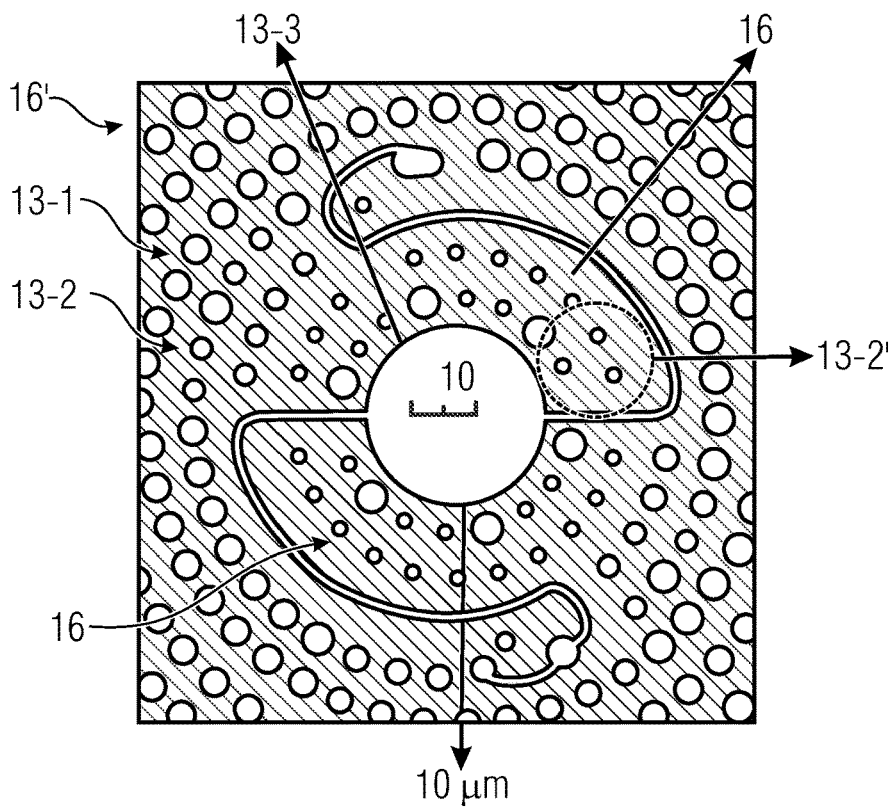
FIG. 5b shows an enlarged plane view of the TMD structure in the stator of the MEMS device according to an embodiment.

FIG. 5a shows a schematic plane view (top view) of a stator 13 of the MEMS device 10 with the TMD structure 16 according to an embodiment. FIG. 5b shows an enlarged plane view of the TMD structure 16 in the stator 13 of the MEMS device 10 according to an embodiment.

As shown in FIG. 5a, an exemplary implementation of the stator 13 of the MEMS device 10, wherein the indicated rectangle 16' shows a possible location of the TMD structure 16 in the stator 13. The stator 13 is formed as a suspended electrode structure mechanically anchored (coupled) to the substrate 14.

The stator 13 may comprise a perforation 13-1 with a plurality of perforation holes or openings 13-2 through the stator material, wherein the perforation holes 13-2 may be essentially equally distributed over the free-standing portion of the stator 13 to allow transmission of sound pressure changes (e.g. to the membrane—not shown). The stator 13 may further comprise a so-called ventilation hole 13-3 for a static pressure equalization (between the opposing sides of the stator electrode 13) e.g. in a center region of the stator 13. In a sealed dual membrane (SDM) configuration (see for example FIG. 8c and the associated text passages), the ventilation hole 13-3 of the stator 13 equalizes the pressure on either side of the membranes 12, 12a. The ventilation hole 13-3 is implemented as a small "tube section" in between the membranes 12, 12a. The hole 13-3 in the stator serves the purpose of going around this "tube section" and providing clearance.

The ventilation hole 13-3 may have a circular, rectangular, etc. cross-section, for example. The diameter of the ventilation hole 13-3 is larger than the diameter of the perforation holes 13-2. The stator may further comprise a contact arrangement 13-4 for electrically contacting the stator electrode 13. The stator 13 may further comprise a segmentation (segmentation line) 13-5 for segmenting the stator 13 in electrically insulated stator electrode portions (e.g. for suppressing parasitic capacitances).

FIG. 5b shows an enlarged plane view of the TMD structure 16 in the stator 16 of the MEMS device 10 according to an embodiment. As shown in FIG. 5b, the TMD structure 16 is formed in the center of the stator 13 as two laterally opposing flaps (wings or fins) adjacent to the ventilation hole 13-3 Band at least partially surrounding the ventilation hole 13-3). The flaps 16 are elastically coupled to the stator 13, wherein the flaps 16 are formed from an integral portion of the electrode material of the stator 13.

As shown in FIG. 5b, the stator (counter-electrode) 13 comprises the perforation 13-1 with the plurality of perforation holes 13-2, wherein at least a part or all of the perforation holes 13-2' in the TMD structure 16, i.e., through the flaps 16 in the stator electrode 13, comprises at least one of a reduced hole diameter and a reduced density of the perforation holes, when compared to the remaining part of the stator electrode 13 (outside the flaps 16). Both arrangements, i.e., either a reduced hole diameter of the perforation holes 13-2 or a less number of perforation holes 13-2 (lower density of perforation holes) than in the remaining part of the stator electrode 13 or a combination of both, provides for an increased viscous damping of the TMD structure 16 in the stator electrode 13.

As exemplarily shown in FIG. 5b, the ventilation hole 13-3 may comprise a diameter between 10 and 50 μm or between 20 and 50 μm, wherein the perforation holes 13-2 may comprise an average diameter of 3 to 8 μm, and wherein the smaller perforation holes (=with reduced diameter) 13-2' in the flaps 16 may comprise a diameter of between 1 and 3 μm and about 1.9 μm. The implemented dimensions of the ventilation hole 13-3 and of the smaller perforation holes 13-2, 13-2' of the MEMS device can be in a range of +/−50% or +/−30% of the indicated dimensions. In FIG. 5b, a ruler (10 μm in size) is shown for scale in the area of the ventilation hole 13-3.

According to an embodiment, the TMD spring element 16-1 of the TMD structure (flap) 16 in the stator 13 may comprise an adjusted modus of resilience (flexibility or spring constant) and an adjusted TMD mass 16-1 for adjusting the TMD resonance frequency of the TMD resonance mode counteracting to (=damping) the MEMS resonance mode having a MEMS resonance frequency. Thus, the resonance frequency of the TMD resonance mode of the TMD structure 16 can be set to or close to the resonance frequency of the MEMS resonance mode.

According to an embodiment, the TMD mass element 16-1 may comprise an additional mass element 16-1a for increasing the resulting TMD mass and for decreasing (or adapting) the resulting TMD resonance frequency. The additional mass element may have an insulating material, e.g. an oxide block, or a conductive material mechanically coupled to the TMD mass element 16-1 of the TMD structure 16.

As shown in FIG. 5b, it is possible to improve the operational characteristics of the MEMS sensor 10 by introducing a different damping for the tuned mass damper 16 by means of different perforation densities in the stator 13. The damping of the TMD region 16 can be different (in terms of pressure per velocity) compared to the rest of the stator, this improves the performance of the TMD structure 16 with very little impact on the noise performance of the overall system.

Figure 6A:
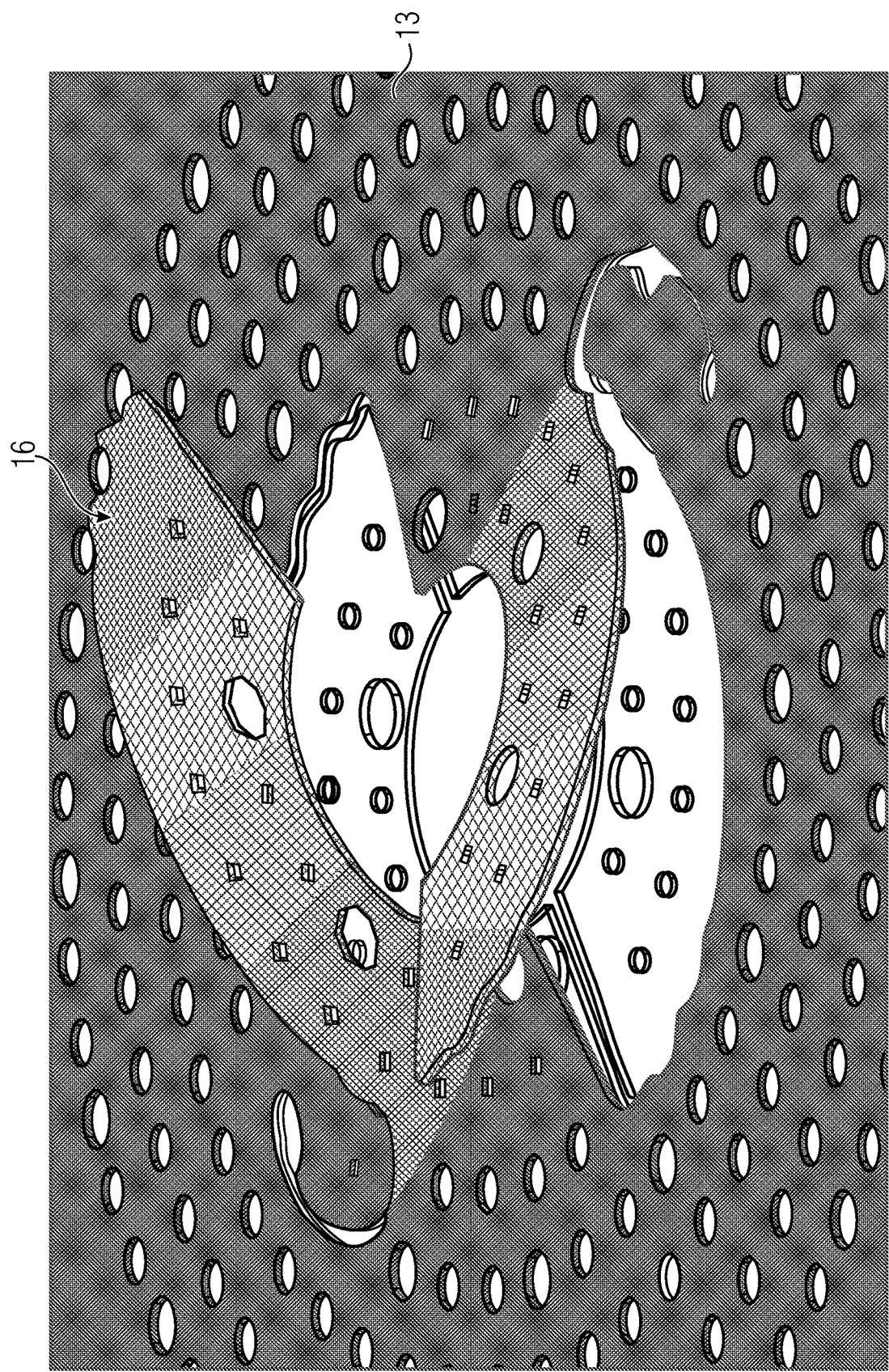
FIGS. 6a-6b show a schematic illustration of an oscillation of the TMD structure in the stator of the MEMS device according to an embodiment.
Figure 6B:
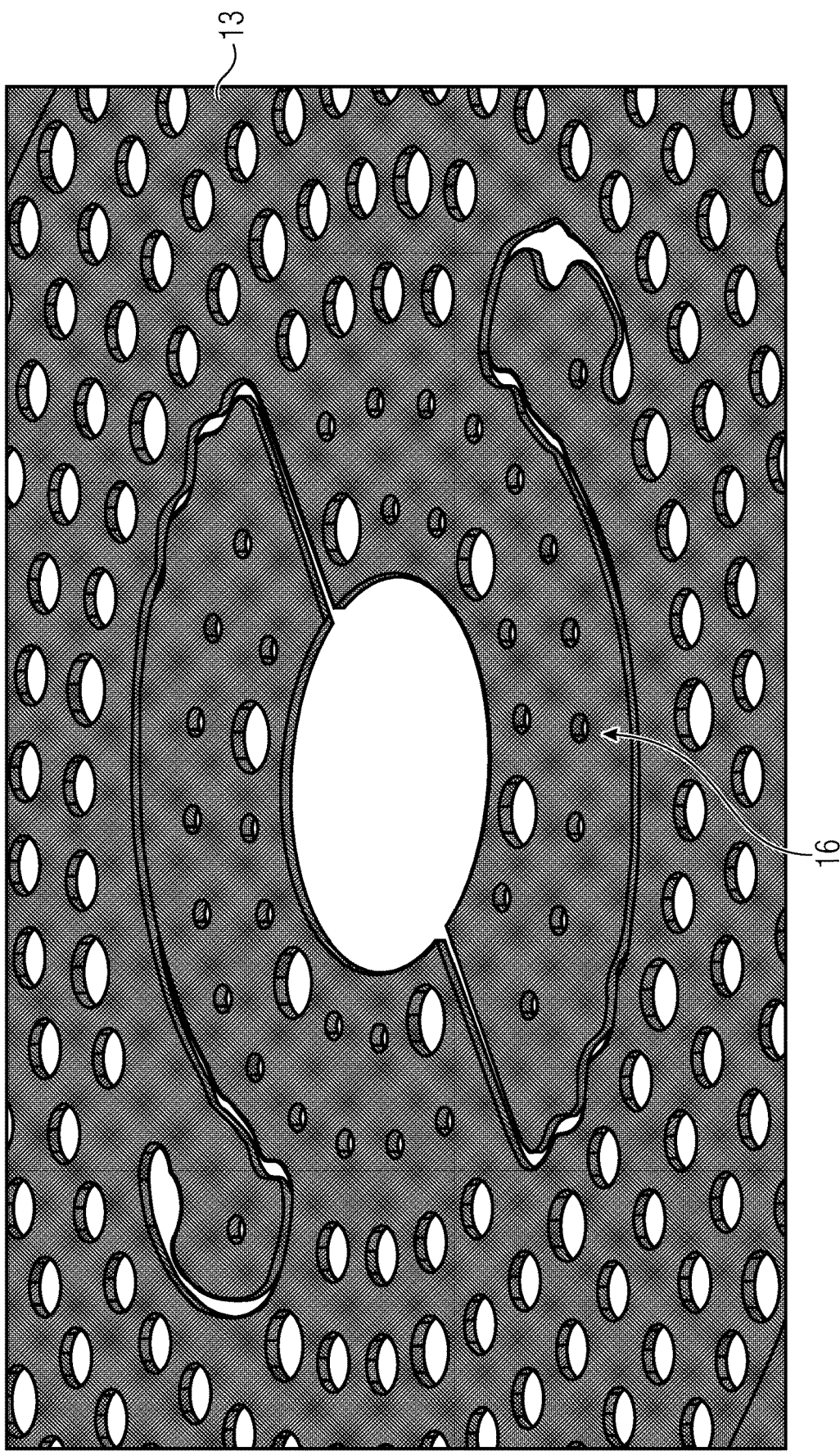

FIGS. 6a-6b exemplarily show a schematic illustration of an oscillation of the TMD structure (flaps) 16 in the stator 13 of the MEMS device 10 according to an embodiment. FIG. 6a shows, for example, a maximum (or nearly maximum) deflection of the TMD structure (flaps) 16, wherein FIG. 6b shows the TMD structure 16 in a zero-crossing position or a rest condition.

Figure 7:
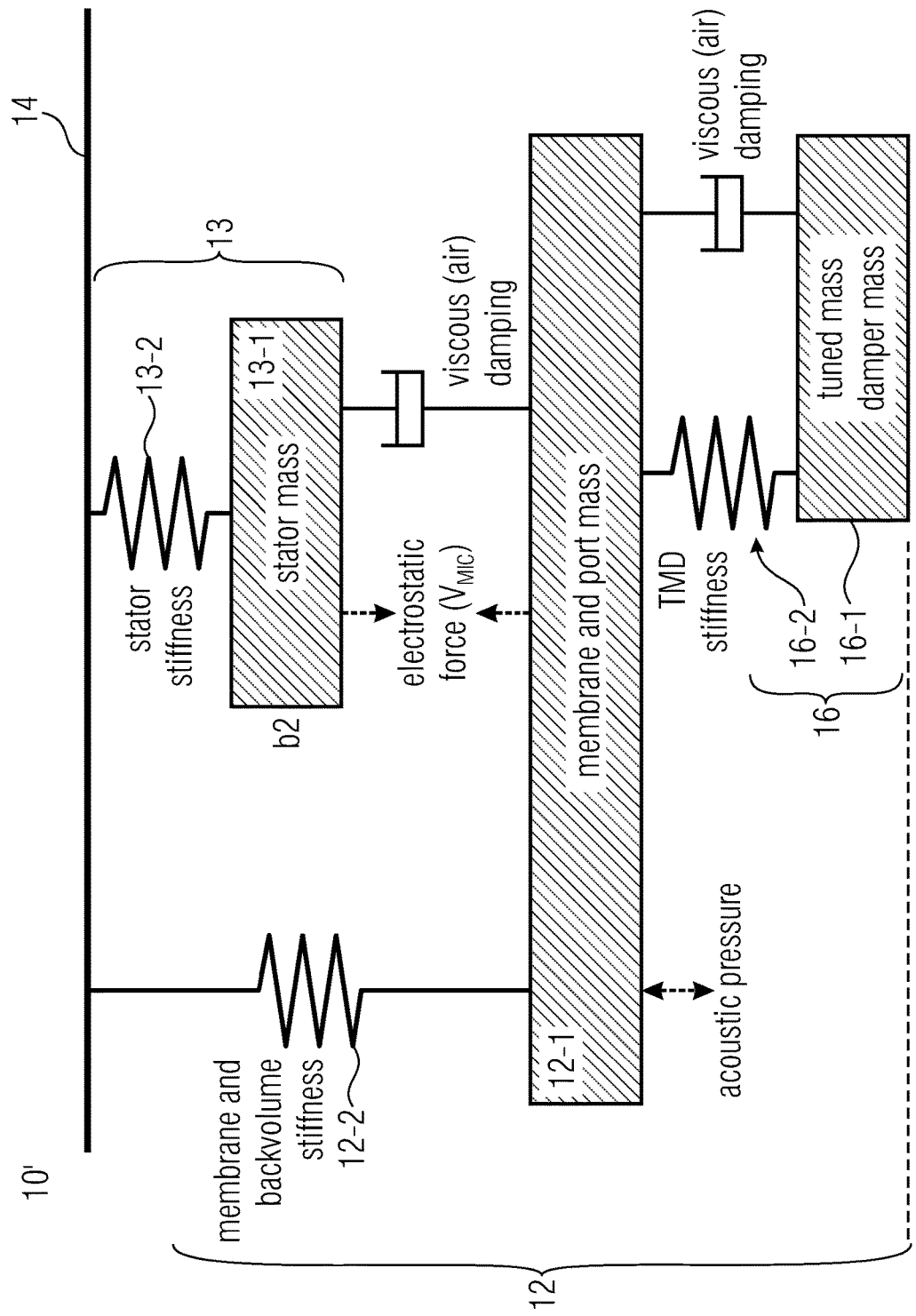
FIG. 7 shows a schematic view of a resulting spring-mass-damper system of the MEMS microphone with the TMD structure as part of the membrane element according to an embodiment.

FIG. 7 shows a schematic view of a resulting spring-mass-damper system of the MEMS microphone 10 with the TMD structure 16 as part of the membrane 12 according to an embodiment. According to an embodiment, the MEMS microphone 10 comprises the first electrode and the second electrode, which are operative as an audio MEMS microphone, wherein the first electrode 12 is the deflectable membrane element and the second electrode 13 is the stator. According to the present embodiment, the TMD structure 16 is an integral portion of the membrane element 12.

As shown in FIG. 7, the deflectable (displaceable) membrane element 12 is anchored to the substrate 14. The deflectable portion of the membrane element 12 forms the membrane mass element 12-1, wherein the flexibility (stiffness) of the membrane element 12 forms the membrane spring element 12-2. The stator is anchored (mechanically coupled) to the substrate 14, wherein the mass of the stator 13 forms the stator mass element 13-1 and the stator stiffness forms the stator spring element 13-2. The TMD structure 16, which comprises the TMD mass element 16-1 and the TMD spring element 16-2, is an integral portion of the membrane element 12.

An acoustic pressure or pressure change from the environment causes a deflection of the membrane element 12, wherein a viscous (air) damping may be present between the membrane element 12 and the stator 13 and between the membrane element 12 and the TMD structure 16, as exemplarily shown in FIG. 7, and/or a viscous (air) damping may be also present in between the stator 13 and the TMD structure 16.

As already indicated with respect to FIGS. 1a-1b, the sound port mass moves in phase with the membrane mass 12-1 at the primary resonance. The restoring force is produced by the membrane 12 and the back volume compliance.

Figure 8A:
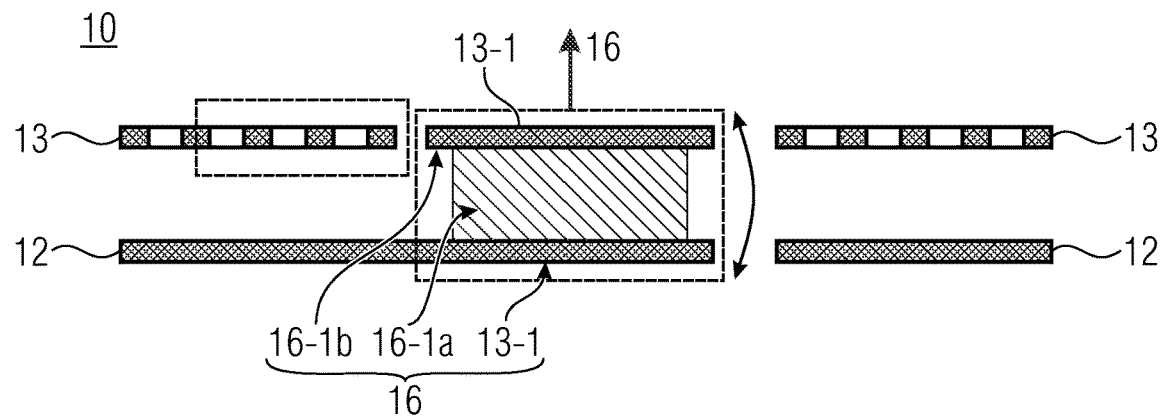
FIGS. 8a-8c show schematic cross-sectional views of different implementations of the TMD structure as part of the membrane of the MEMS device according to an embodiment.
Figure 8B:
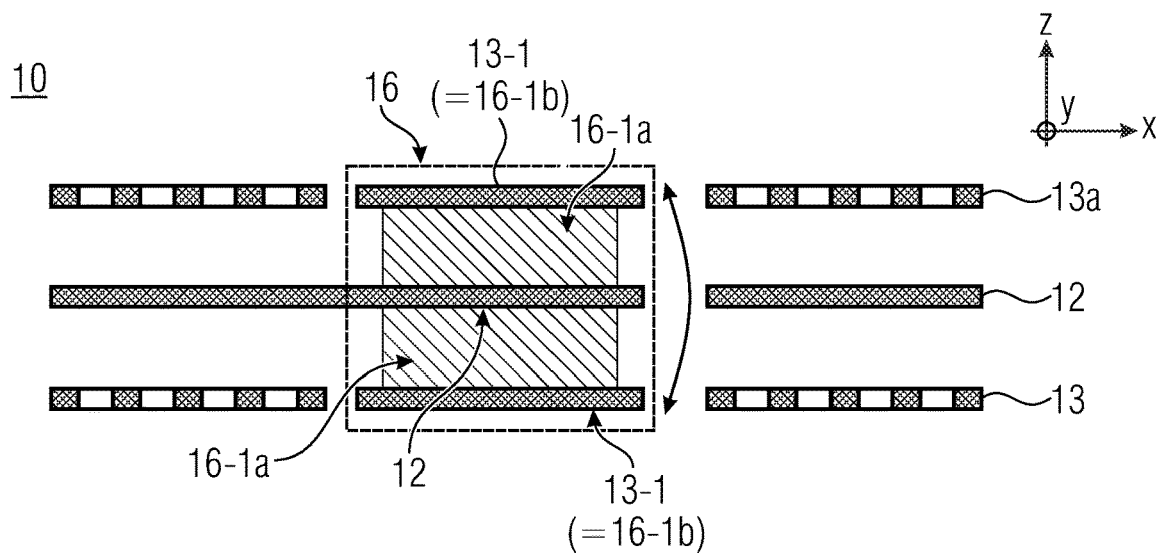
Figure 8C:
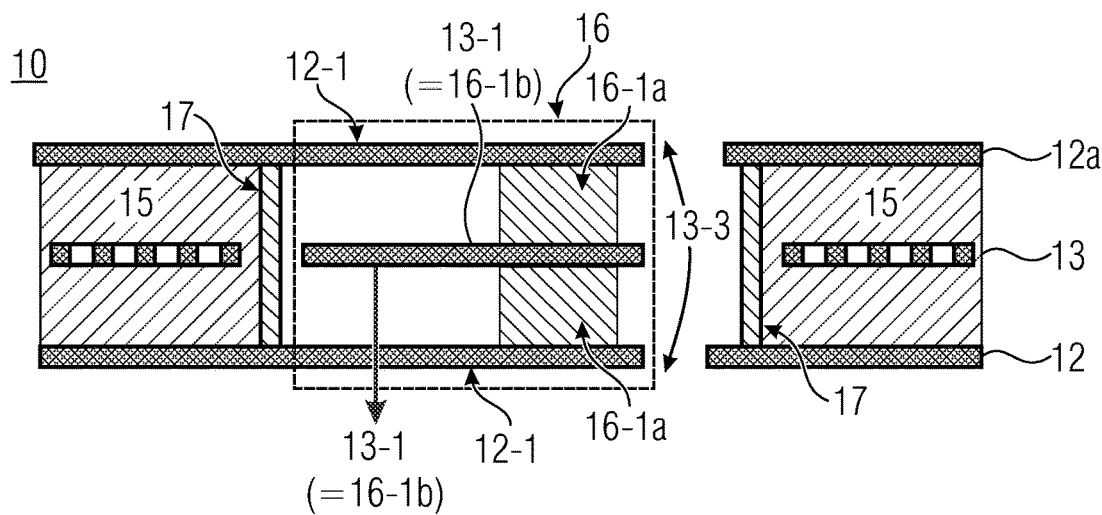

FIGS. 8a-8c show schematic cross-sectional views of different implementations of the TMD structure 16 as (integral) part of the membrane 12 of the MEMS device 10 according to further embodiments. The MEMS device 10 may be operative as an audio microphone in different configurations, such as a single membrane and single backplate (single stator) configuration, a dual backplate (dual stator) configuration and a (e.g. sealed) dual membrane configuration, for example.

FIG. 8a shows a schematic cross-sectional view of the MEMS device 10 in single membrane and single backplate configuration. As shown in FIG. 8a, the MEMS sound transducer 10 has the membrane element 12 and the counter-electrode (=stator) 13. The membrane element and the counter-electrode, respectively, can comprise a semi-conductive layer or, also, a layer sequence or layer stack having a plurality of different layers, wherein at least one of the layers is electrically conductive. The layer arrangement may be positioned on the carrier substrate 14, wherein the membrane element 12 and the counter-electrode 13 are separated and spaced apart from one another. The counter-electrode, 13, which is generally configured to be more rigid than the deflectable membrane element 12, is spaced apart at a distance D from the membrane element, with the result that a capacitance $C_o$ (=MEMS capacitance=capacitance of the MEMS microphone 10) can form between the counter electrode structure 13 and the membrane structure 12 and can be sensed by means of a readout circuitry 20. The non-clamped region of the membrane structure 12 (with respect to the counter-electrode structure 13) is referred to as the deflectable (=displaceable) or movable region (=active region) of the membrane structure 12. A deflection $\Delta x$ of the membrane structure 12 relative to the counter electrode structure 13 can then be detected and read out as a capacitance change $\Delta C$ by means of the readout circuitry 20 in order to provide a corresponding (analog or AD-converted digital) output signal $S_{out}$ of the MEMS device 10. The deflection of the membrane structure 12 is (generally) caused by an acoustic sound pressure change in the environment.

According to an embodiment of the MEMS device 10, the TMD structure 16 is an integral portion of the membrane element 12 of the MEMS device 10. The TMD spring element 16-2 comprises an adjusted modus of resilience (spring constant) and an adjusted TMD mass 16-1 for adjusting a TMD resonance frequency of the TMD resonance mode counteracting to (=damping) the MEMS resonance mode having a MEMS resonance frequency. The motion (oscillation) of the TMD structure 16 is partially coupled to but independent from the motion of the membrane structure 12.

As shown in FIG. 8a, the TMD mass element 16-1 may comprise an additional mass element 16-1a for increasing the resulting TMD mass 16-1 and for decreasing (adapting) the resulting TMD resonance frequency. The additional mass element 16-1a may comprise an insulating material (e.g. an oxide block) and/or a conductive material. The TMD structure 16 is an integral portion of the first suspended electrode 12, wherein a separated part 13-1 (=mechanically decoupled from a second electrode) of a second suspended electrode 13 may form a further additional mass element 16-1b of the TMD structure 16. The additional mass element 16-1 may be mechanically coupled between the further additional mass element 16-1b and the portion 12-1 of the membrane structure 12, which is an integral part of the TMD structure 16. As shown in FIG. 8a, the tuned mass damper mass 16-1 may comprise the additional mass elements 16-1a and/or 16-1b (attached to the membrane 12) for reducing the resonant frequency of the TMD structure 16, especially for the primary resonance. The acoustic pressure or pressure change from the environment causes a deflection of the membrane element 12, wherein a viscous (air) damping may be present may be present in between the stator 13 and the TMD structure 16.

FIG. 8b shows a schematic cross-sectional view of the MEMS device 10 in a dual (or double) counter-electrode configuration (dual backplate or dual stator configuration), wherein the MEMS device 10 may comprise a first suspended counter-electrode structure 13 anchored to the substrate 14 and a further (second) counter-electrode structure 13a anchored to the substrate 14, such that the membrane structure 12 anchored to the substrate 14 is arranged between the first and second counter electrode structures 13, 13a. In case of the dual-counter-electrode configuration, the read-out circuitry 20 may be configured to detect the deflection or displacement $\Delta x$ of the membrane structure 12 relative to the counter electrode structure 13 and/or relative to the further (second) counter electrode structure 13a, depending on a single-ended (common mode) or differential readout configuration. The deflection of the membrane structure 12 is again caused by an acoustic sound pressure change in the environment.

Also in the embodiment of FIG. 8b, the TMD structure 16 is an integral portion of the membrane element 12 of the MEMS device 10. The TMD spring element 16-2 comprises an adjusted modus of resilience (spring constant) and an adjusted TMD mass 16-1 for adjusting a TMD resonance frequency of the TMD resonance mode counteracting to (=damping) the MEMS resonance mode having a MEMS resonance frequency. The motion (oscillation) of the TMD structure 16 is partially coupled to but independent from the motion of the membrane structure 12.

As shown in FIG. 8b, the TMD mass element 16-1 may comprise at least one (or two) of the additional mass elements 16-1a for increasing the resulting TMD mass 16-1 and for decreasing (adapting) the resulting TMD resonance frequency. The additional mass element(s) 16-1a may comprise an insulating material (e.g. an oxide block) and/or a conductive material. The TMD structure 16 is an integral portion of the first suspended electrode 12, wherein a separated part 13-1 (=mechanically decoupled from the second electrode 13) of a second suspended electrode 13 may form at least one (or two) further additional mass element 16-1b of the TMD structure 16. The additional mass element(s) 16-1a may be respectively mechanically coupled between the further additional mass element(s) 16-1b and the portion 12-1 of the membrane structure 12, which is an integral part of the TMD structure 16. As shown in FIG. 8b, the tuned mass damper mass 16-1 attached to the membrane 12 and may comprise the additional mass elements 16-1a and/or 16-1b (attached to the membrane 12) for reducing the resonant frequency of the TMD structure 16, especially for the primary resonance. The acoustic pressure or pressure change from the environment causes a deflection of the membrane element 12, wherein a viscous (air) damping may be present may be present in between the stator 13 and the TMD structure 16.

FIG. 8c shows a schematic cross-sectional view of the MEMS device in a dual (double) membrane configuration. The MEMS device 10 comprises a third suspended electrode 12a anchored to the substrate 14, wherein the first electrode structure 12 is a first membrane element, the second electrode 13 is a counter-electrode, and the third electrode 12a is a second membrane element of the audio microphone. The counter-electrode (stator) 13 is arranged between the first and second membrane element 12, 12a, wherein a mechanical coupling structure 15 (with at least one or a plurality mechanical connection elements) is mechanically coupled between the first and third electrode (first and second membrane element) 12, 12a and is mechanically de-coupled from the second electrode (counter-electrode) 13.

In the sealed dual membrane (SDM) configuration, the first and second membrane structures 12, 12a are arranged in a hermetically sealed configuration, and a cavity 15 may be formed between the first and the second membrane structure 12, 12a, wherein the counter-electrode structure 13 is arranged in the cavity (volume under vacuum) 15, e.g. when compared to the environmental atmosphere. The cavity 15 may comprise a reduced atmospheric pressure, e.g., a "vacuum" with an atmospheric pressure of about or below 100 Torr, 50 Torr, 5 Torr or 1 Torr. In the sealed dual membrane (SDM) configuration, the ventilation hole 13-3 of the stator 13 equalizes the pressure on either side of the membranes 12, 12a. The ventilation hole 13-3 is implemented as a small "tube section" in between the membranes 12, 12a. The hole 13-3 in the stator serves the purpose of going around this "tube section" and providing clearance.

Upon a deflection of the first and second (mechanically coupled) membrane structures 12, 12a relative to the counter electrode structure 13, that deflection or displacement can in turn be read out capacitively, for example, by the readout circuitry 20 in order to provide the output signal $S_{out}$ dependent on the deflection (gap change) with respect to the counter electrode structure 13. The deflection of the membrane structure 12, 12a is caused by an acoustic sound pressure change in the environment.

Also in the embodiment of FIG. 8c, the TMD structure 16 is an integral portion of the membrane elements 12, 12a of the MEMS device 10. The TMD spring element 16-2 comprises an adjusted modus of resilience (spring constant) and an adjusted TMD mass 16-1 for adjusting a TMD resonance frequency of the TMD resonance mode counteracting to (=damping) the MEMS resonance mode having a MEMS resonance frequency. The motion (oscillation) of the TMD structure 16 is partially coupled to but independent from the motion of the membrane structure 12.

As shown in FIG. 8c, the TMD mass element 16-1 may comprise at least one (or 2) of the additional mass elements 16-1a for increasing the resulting TMD mass 16-1 and for decreasing (adapting) the resulting TMD resonance frequency. The additional mass element(s) 16-1a may comprise an insulating material (e.g. an oxide block) and/or a conductive material. The TMD structure 16 is an integral portion 12-1 of the first suspended membrane elements 12, 12a, wherein a separated part 13-1 (=mechanically decoupled from the second electrode 13) of a second suspended electrode 13 may form a further additional mass element 16-1b of the TMD structure 16. The further additional mass element 16-1b may be mechanically coupled between the additional mass elements 16-1a and the portions 12-1 of the membrane elements 12, 12a, which are an integral part of the TMD structure 16. As shown in FIG. 8c, the tuned mass damper mass 16-1 is attached to the membrane 12 and may comprise the additional mass elements 16-1a and/or 16-1b for reducing the resonant frequency of the TMD structure 16, especially for the primary resonance. The material (e.g. poly Si) of the stator may be used to form the further additional mass element 16-1b of the TMD structure 16 for providing an additional damping effect. The acoustic pressure or pressure change from the environment causes a deflection of the membrane element 12, wherein a viscous (air) damping may be present between the membrane element 12 and the stator 13 and between the membrane element 12 and the TMD structure 16 (see also FIG. 7).

Figure 9A:
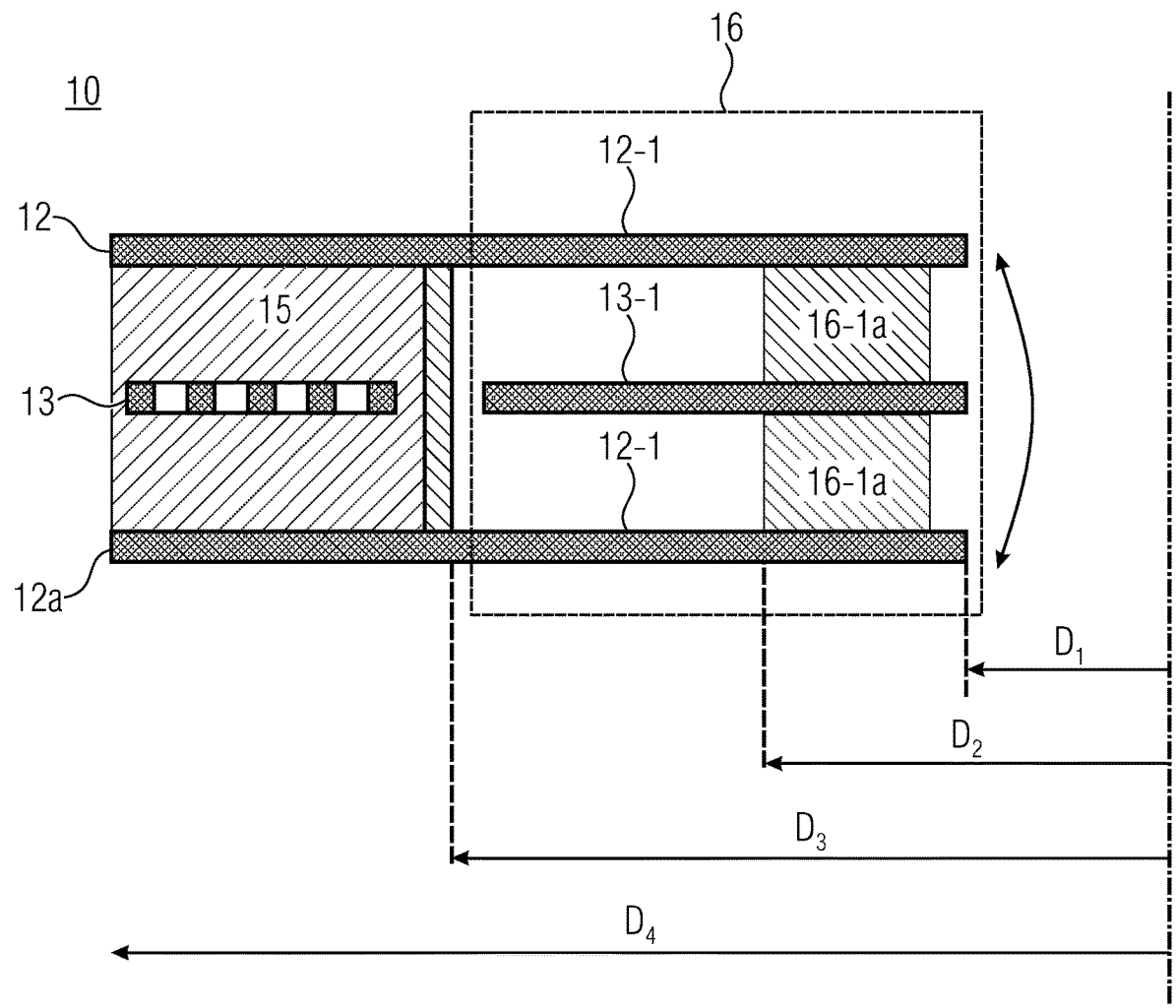
FIGS. 9a shows typical dimensions of the relevant elements of the MEMS device 10 having the TMD structure 16 according to an embodiment.

FIG. 9a shows typical dimensions of the relevant elements of the MEMS device 10 having the TMD structure 16. The implemented dimensions of the MEMS device can be in a range of +/−50% or +/−30% of the indicated dimensions. D1 is approximately the gap between the TMD structure 16 to the neighboring membrane elements 12, 12a and counter-electrode 13, D1 may be about 16 µm or in a range between 12 and 20 µm. D2 is approximately the lateral extension of the additional mass element 16-1b. D2 may about 108 µm (=D1+92 µm) or in a range between 100 and 120 µm. D3 is approximately the lateral distance between the additional mass element 16-1b and the cavity 15. D3 may be about 286 µm (=D1+270 µm) or in a range between 270 and 300 µm. D4 is approximately the radius of the membrane elements 12, 12a and the counter-electrode 13. D4 may be about 1275 µm or in a range between 1200 and 1350 µm. The area covered by/used for the TMD structure is approximately 5% of the total membrane area and approximately 8% of the active (inside segmentation) area of the membrane element.

Figure 9B:
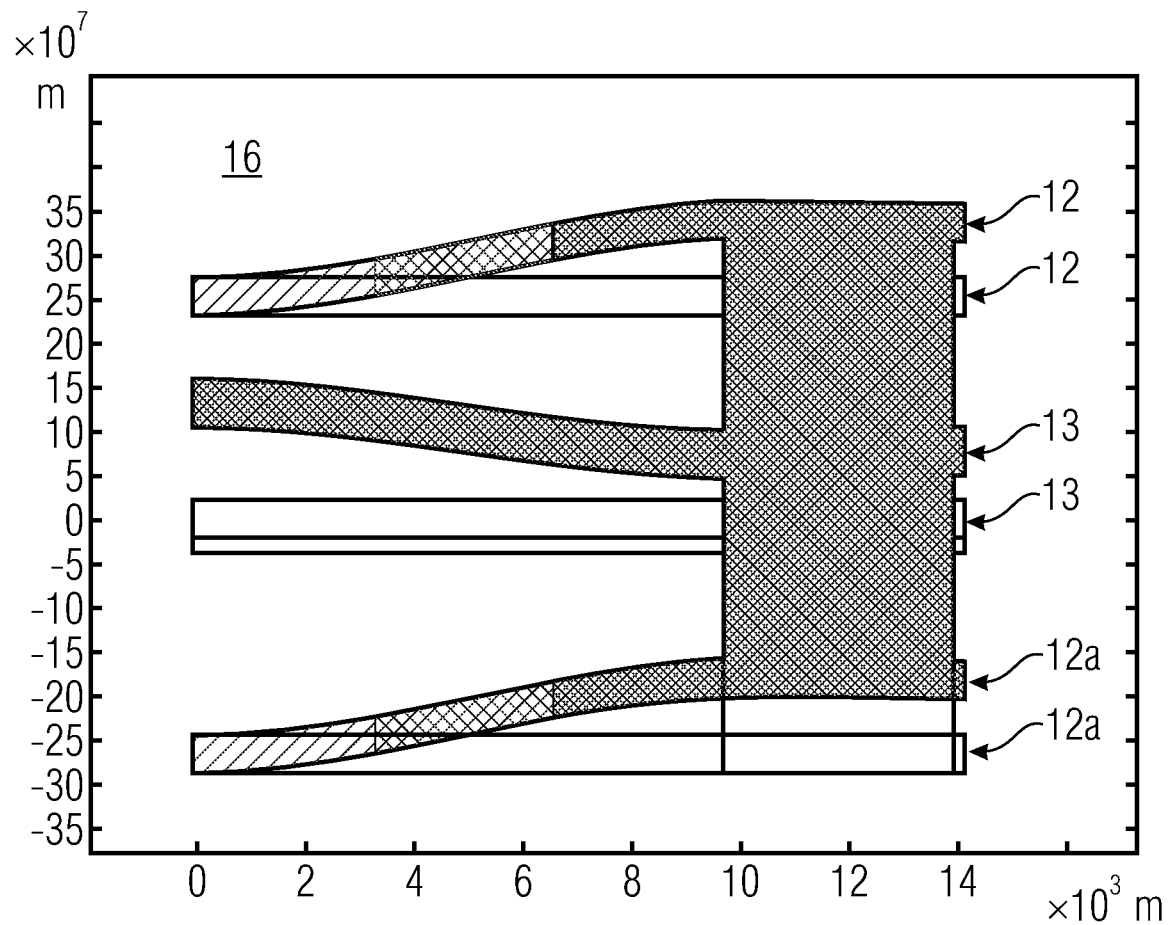
FIG. 9b shows a schematic illustration of an oscillation of the TMD structure in the stator of the MEMS device according to an embodiment.

FIG. 9b exemplarily shows a schematic illustration of an oscillation of the TMD structure 16 in the membrane structure 12, 12a of the MEMS device 10 according to an embodiment. FIG. 9b shows, for example, a maximum (or nearly maximum) deflection of the TMD structure 16, in comparison to a zero-crossing position or a rest condition.

In the following, some technical effects of the above-described MEMS sensor 10 with TMD structure are summarized, wherein the tuned mass damper concept allows controlling two of the resonant modes of the microphones, i.e. the primary resonance and/or stator resonance.

Primary resonance TMD:

For the primary resonance tuned mass damper (TMD structure) 16, the tuned mass damper design can be matched to the sound port characteristics of the customer system.

Primary mode implementation reduces the required compromise between low noise and acoustic frequency response flatness.

The acoustic response flatness of the MEMS device 10 can be maintained while keeping the SNR compromise to a lower value (than is required by the current solutions).

Stator resonance (third resonance) TMD:

The stator resonance TMD reduces the required compromise between low noise and high resonance performance, e.g. a high suppression of unwanted resonances.

Unwanted oscillations and/or high total harmonic distortion values can be reduced. Alternatively, SNR (signal-to-noise-ratio) can be increased while keeping the resonance performance high.

Additional embodiments and aspects are described which may be used alone or in combination with the features and functionalities described herein.

According to an embodiment, the MEMS device comprises a suspended electrode structure anchored to a substrate, the MEMS device having a (undesired) MEMS resonance mode, and a TMD (tuned mass damping) structure, wherein a portion of the suspended electrode structure is arranged to (integrally) form the TMD structure having a TMD spring element and a TMD mass element, for providing a TMD resonance mode counteracting the MEMS resonance mode.

According to an embodiment, the MEMS device comprises a first and a second suspended electrode, which are both spaced apart from each other and at least partially oppose each other, and which are both anchored to the substrate.

According to an embodiment, the TMD structure is arranged at a center portion of the first or second suspended electrode.

According to an embodiment, the TMD structure is arranged adjacent to a ventilation hole in the first or second suspended electrode.

According to an embodiment, the first electrode and the second electrode are operative as a sound transducer.

According to an embodiment, the first electrode and the second electrode are operative as a capacitive sensor.

According to an embodiment, the first electrode and the second electrode are operative as an audio microphone.

According to an embodiment, the first electrode is a (deflectable) membrane element and the second electrode is a (static) counter-electrode (backplate).

According to an embodiment, the TMD structure is an integral portion of the (movable) membrane element.

According to an embodiment, the TMD structure is an integral portion of the (static) counter-electrode.

According to an embodiment, the counter-electrode comprises a perforation with a plurality of perforation holes, wherein at least a part of the perforation holes in the counter-electrode portion of the TMD element comprises a reduced hole diameter and/or a reduced density of holes when compared to the remaining part of the counter-electrode.

According to an embodiment, the TMD spring element comprises an adjusted modus of resilience (flexibility or spring constant) and an adjusted TMD mass for adjusting a TMD resonance frequency of the TMD resonance mode counteracting to (damping) the MEMS resonance mode having a MEMS resonance frequency.

According to an embodiment, the TMD mass element comprises an additional mass element for increasing the resulting TMD mass and for decreasing (adapting) the resulting TMD resonance frequency.

According to an embodiment, the TMD structure is an integral portion of the first element suspended electrode, wherein a separated (=mechanically decoupled from the second electrode) part of the second suspended electrode forms an additional mass element of the TMD structure.

According to an embodiment, the MEMS device is operative as an audio microphone in a single counter-electrode (backplate) configuration, a dual counter-electrode configuration or a sealed dual membrane configuration.

According to an embodiment, the MEMS device is arranged in a dual (double) counter-electrode configuration and comprises a third suspended electrode anchored to the substrate, and wherein the first electrode is a first counter-electrode, the second electrode is a membrane element, and the third electrode is a second counter-electrode of the audio microphone, wherein the membrane element is arranged between the first and second counter electrode.

According to an embodiment, wherein the MEMS device is arranged in a dual (double) membrane configuration and comprises a third suspended electrode anchored to the substrate, and wherein the first electrode is a first membrane element, the second electrode is a counter-electrode, and the third electrode is a second membrane element of the audio microphone, wherein the counter-electrode is arranged between the first and second membrane element, and wherein a mechanical coupling structure is mechanically coupled between the first and third electrode (first and second membrane element) and is mechanically de-coupled from the second electrode (counter-electrode).

Additional embodiments and aspects are described which may be used alone or in combination with the features and functionalities described herein.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

Depending on certain implementation requirements, embodiments of the control circuitry can be implemented in hardware or in software or at least partially in hardware or at least partially in software. Generally, embodiments of the control circuitry can be implemented as a computer program product with a program code, the program code being operative for performing one of the methods when the computer program product runs on a computer. The program code may for example be stored on a machine readable carrier.

In the foregoing detailed description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the detailed description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A MEMS device comprising:
   a suspended electrode structure anchored to a substrate, the MEMS device having a MEMS resonance mode; and
   a TMD (tuned mass damping) structure, wherein a portion of the suspended electrode structure is arranged to form the TMD structure having a TMD spring element and a TMD mass element, for providing a TMD resonance mode counteracting the MEMS resonance mode.

2. The MEMS device according to claim 1, wherein the MEMS device comprises a first suspended electrode and a second suspended electrode, which are both spaced apart from each other and at least partially oppose each other, and which are both anchored to the substrate.

3. The MEMS device according to claim 2, wherein the TMD structure is arranged at a center portion of the first suspended electrode or the second suspended electrode.

4. The MEMS device according to claim 2, wherein the TMD structure is arranged adjacent to a ventilation hole in the first suspended electrode or the second suspended electrode.

5. The MEMS device according to claim 2, wherein the first electrode and the second electrode are operative as a sound transducer.

6. The MEMS device according to claim 2, wherein the first electrode and the second electrode are operative as a capacitive sensor.

7. The MEMS device according to claim 2, wherein the first electrode and the second electrode are operative as an audio microphone.

8. The MEMS device according to claim 2, wherein the first electrode is a membrane element and the second electrode is a counter-electrode.

9. The MEMS device according to claim 8, wherein the TMD structure is an integral portion of the membrane element.

10. The MEMS device according to claim 8, wherein the TMD structure is an integral portion of the counter-electrode.

11. The MEMS device according to claim 10, wherein the counter-electrode comprises a perforation with a plurality of perforation holes, wherein at least a part of the perforation holes in the counter-electrode portion of the TMD element comprises a reduced hole diameter and/or a reduced density of holes when compared to the remaining part of the counter-electrode.

12. The MEMS device according to claim 2, wherein the TMD structure is an integral portion of the first suspended electrode, wherein a separated part of the second suspended electrode forms an additional mass element of the TMD structure.

13. The MEMS device according to claim 2, wherein the MEMS device is arranged in a dual counter-electrode configuration and comprises a third suspended electrode anchored to the substrate, and wherein the first suspended electrode is a first counter-electrode, the second suspended electrode is a membrane element, and the third electrode is a second counter-electrode, and wherein the membrane element is arranged between the first counter electrode and the second counter electrode.

14. The MEMS device according to claim 2, wherein the MEMS device is arranged in a dual membrane configuration and comprises a third suspended electrode anchored to the substrate, and wherein the first electrode is a first membrane element, the second electrode is a counter-electrode, and the third electrode is a second membrane element, wherein the counter-electrode is arranged between the first membrane element and the second membrane element, and wherein a mechanical coupling structure is mechanically coupled between the first electrode and the third electrode and is mechanically de-coupled from the second electrode.

15. The MEMS device according to claim 1, wherein the TMD spring element comprises an adjusted modus of resilience and an adjusted TMD mass for adjusting a TMD resonance frequency of the TMD resonance mode counteracting to the MEMS resonance mode having a MEMS resonance frequency.

16. The MEMS device according to claim 1, wherein the TMD mass element comprises an additional mass element for increasing a resulting TMD mass and for decreasing a resulting TMD resonance frequency.

17. The MEMS device according to claim 1, wherein the MEMS device is operative as an audio microphone in a single counter-electrode configuration, a dual counter-electrode configuration or a sealed dual membrane configuration.

* * * * *